United States Patent
Kanarsky et al.

(10) Patent No.: US 7,968,915 B2
(45) Date of Patent: Jun. 28, 2011

(54) DUAL STRESS MEMORIZATION TECHNIQUE FOR CMOS APPLICATION

(75) Inventors: Thomas S. Kanarsky, Hopewell Junction, NY (US); Qiqing Ouyang, Yorktown Heights, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/538,110

(22) Filed: Aug. 8, 2009

(65) Prior Publication Data
US 2009/0298297 A1     Dec. 3, 2009

Related U.S. Application Data

(62) Division of application No. 11/758,291, filed on Jun. 5, 2007, now Pat. No. 7,834,399.

(51) Int. Cl.
*H01L 21/8238* (2006.01)
(52) U.S. Cl. .................. 257/199; 257/E21.162
(58) Field of Classification Search .................. 257/369, 257/347, 351, E21.162; 438/199, 229
See application file for complete search history.

(56) References Cited

U.S. PATENT DOCUMENTS

| | | | |
|---|---|---|---|
| 7,226,834 B2 | 6/2007 | Bu et al. | |
| 7,511,348 B2 | 3/2009 | Ko et al. | |
| 2002/0020922 A1 | 2/2002 | Yamada et al. | |
| 2005/0158937 A1 | 7/2005 | Yang et al. | |
| 2007/0090395 A1 | 4/2007 | Sebe et al. | |
| 2007/0105368 A1 | 5/2007 | Tsui et al. | |
| 2007/0187770 A1 | 8/2007 | Ahn et al. | |
| 2007/0202653 A1* | 8/2007 | Hoentschel et al. | 438/301 |
| 2007/0249069 A1* | 10/2007 | Alvarez et al. | 438/14 |
| 2008/0054415 A1* | 3/2008 | Frohberg et al. | 257/642 |
| 2008/0061285 A1 | 3/2008 | Arghavani et al. | |
| 2008/0081480 A1* | 4/2008 | Frohberg et al. | 438/703 |
| 2008/0083955 A1 | 4/2008 | Kanarsky et al. | |
| 2008/0099786 A1* | 5/2008 | Maeda et al. | 257/190 |
| 2008/0124855 A1 | 5/2008 | Widodo et al. | |
| 2008/0169484 A1 | 7/2008 | Chuang et al. | |
| 2008/0179661 A1* | 7/2008 | Richter et al. | 257/327 |
| 2008/0237734 A1* | 10/2008 | Hung et al. | 257/374 |
| 2008/0303062 A1 | 12/2008 | Mimura et al. | |

FOREIGN PATENT DOCUMENTS

| CN | 1445838 A | 10/2003 |
|---|---|---|
| CN | 1971882 A | 5/2007 |

* cited by examiner

*Primary Examiner* — Nathan W Ha
(74) *Attorney, Agent, or Firm* — Scully, Scott, Murphy & Presser, P.C.; Louis J. Percello, Esq.

(57) ABSTRACT

A stress-transmitting dielectric layer is formed on the at least one PFET and the at least one NFET. A tensile stress generating film, such as a silicon nitride, is formed on the at least one NFET by blanket deposition and patterning. A compressive stress generating film, which may be a refractive metal nitride film, is formed on the at least one PFET by a blanket deposition and patterning. An encapsulating dielectric film is deposited over the compress stress generating film. The stress is transferred from both the tensile stress generating film and the compressive stress generating film into the underlying semiconductor structures. The magnitude of the transferred compressive stress from the refractory metal nitride film may be from about 5 GPa to about 20 GPa. The stress is memorized during an anneal and remains in the semiconductor devices after the stress generating films are removed.

6 Claims, 11 Drawing Sheets

DUAL STRESS MEMORIZATION TECHNIQUE FOR CMOS APPLICATION

CROSS-REFERENCE TO RELATED APPLICATIONS

This application is a divisional of U.S. Ser. No. 11/758,291, filed Jun. 5, 2007, the entire contents of which are incorporated herein by reference.

BACKGROUND

The present invention generally relates to semiconductor structures, and particularly to a semiconductor structure comprising semiconductor devices with compressive stress memorization and semiconductor devices with tensile stress memorization on the same substrate, and methods of manufacturing the same.

Manipulating stress is an effective way of improving the minority carrier mobility in a metal oxide semiconductor field effect transistor (MOSFET) and increasing the transconductance (or reduced serial resistance) of the MOSFET that requires relatively small modifications to semiconductor processing while providing significant enhancement to MOSFET performance.

When stress is applied to the channel of a semiconductor transistor, the mobility of carriers, and as a consequence, the transconductance and the on-current of the transistor, are altered from their original values for an unstressed semiconductor. This is because the applied stress and the resulting strain on the semiconductor structure within the channel affects the band gap structure (i.e., breaks the degeneracy of the band structure) and changes the effective mass of the carriers. The effect of the stress depends on the crystallographic orientation of the plane of the channel, the direction of the channel within the crystallographic orientation, and the direction of the applied stress.

The effect of uniaxial stress, i.e., a stress applied along one crystallographic orientation, on the performance of semiconductor devices, especially on the performance of a MOSFET (or a "FET" in short) device built on a silicon substrate, has been extensively studied in the semiconductor industry. For a PMOSFET (or a "PFET" in short) utilizing a silicon channel, the mobility of minority carriers in the channel (which are holes in this case) increases under uniaxial compressive stress along the direction of the channel, i.e., the direction of the movement of holes or the direction connecting the drain to the source. Conversely, for an NMOSFET (or an "NFET" in short) devices utilizing a silicon channel, the mobility of minority carriers in the channel (which are electrons in this case) increases under uniaxial tensile stress along the direction of the channel, i.e., the direction of the movement of electrons or the direction connecting the drain to the source. These opposite requirements for the type of stress for enhancing carrier mobility between the PMOSFETs and NMOSFETs have led to prior art methods for applying at least two different types of stress to the semiconductor devices on the same integrated chip.

Different methods of "stress engineering," or "strain engineering" as it is alternatively called, on the channel of a MOSFET have been known in the prior art.

One group of methods create a "global stress," that is, a stress applied to a general transistor device region generated from the substrate. A global stress is generated by such structures as SiGe stress relaxed buffer layers, Si:C stress relaxed buffer layers, or silicon germanium structures on an insulator.

Another group of methods generate a "local stress," that is, a stress applied only to local areas adjacent to the channel from a local structure. A local stress is generated by such structures as stress liners, embedded SiGe source/drain structures, embedded Si:C source/drain structures, stress-generating shallow trench isolation structures, and stress-generating silicides. An increase in the on-current of up to 50% and an overall chip speed increase up to 40% have been reported on semiconductor devices utilizing these methods.

A method of applying a local stress is a technique that is commonly referred to as "stress memorization technique," according to which a tensile stress generating dielectric film is deposited over a structure, e.g., a field effect transistor, to which tensile stress is to be applied. During a high temperature anneal, the tensile stress generating film applies tensile stress to the underlying semiconductor devices. After the anneal, the stress applied to the underlying semiconductor devices is frozen, or "memorized," hence the name "stress memorization technique." After the tensile stress generating dielectric film is removed, the underlying structure still maintains the memorized stress. Use of a highly tensile nitride film as a stress generating film has been successfully demonstrated, resulting in a uniaxial tensile stress on the order of about 2 GPa along the direction of the channel of an NFET.

Generation of a compressive stress through a stress memorization technique, i.e., application of a compressive stress on a semiconductor device by transferring compressive stress from a compressive stress generating liner, has proven to be difficult since compressive nitride films tend to relax during a high temperature anneal, resulting in a stress transfer of only an insignificant level of stress, e.g., a compress stress on the order of, or less than, 100 MPa in magnitude.

Further, known stress memorization techniques generate a stress on the order of, or less than, about 3 GPa. Since the alteration of the band structure is proportional to the magnitude of the stress, an even higher level of uniaxial stress is expected to enhance the mobility of one of the two types of MOSFETs, i.e., one of the PFETs and NFETs.

In view of the above, there exists a need for a compressive stress memorization technique that transfers compressive stress to a semiconductor device, e.g., a PFET.

Also, there exists a need for a semiconductor structure and methods of manufacturing the same wherein both p-type and n-type semiconductor devices have enhanced minority carrier mobility by employing a dual stress memorization technique, that is, a compressive stress memorization technique on one type of devices and a tensile stress memorization technique on another type of devices.

Furthermore, there exists a need for a structure and methods of manufacturing the same wherein a higher level of stress is transmitted to at least one of the two types of field effect transistors, i.e., PFETs and NFETs.

BRIEF SUMMARY

The present invention addresses the needs described above by providing a compressive stress memorization technique, in which a high level of compressive stress is transferred from a compressive stress generating film to underlying semiconductor structure during a high temperature anneal.

The present invention further provides semiconductor structures in which both a compressive stress memorization technique and a tensile stress memorization technique are employed to enhance minority carrier mobility of PFETs and NFETs, and methods of manufacturing the same.

At least one PFET and at least one NFET are formed on a semiconductor substrate, each having a gate electrode and a spacer. The semiconductor substrate may have a built-in stress or may be substantially free from external stress prior to processing. A stress-transmitting dielectric layer is formed on the at least one PFET and the at least one NFET. A tensile stress generating film, such as a silicon nitride as known in the art, is formed on the at least one NFET by blanket deposition and patterning. A compressive stress generating film, which may be a refractive metal nitride film, is formed on the at least one PFET by blanket deposition and patterning. An encapsulating dielectric film, which prevents metallic contamination during a high temperature anneal, is deposited over the compress stress generating film. The stress is transferred from both the tensile stress generating film and the compressive stress generating film into the underlying semiconductor structures. The magnitude of the transferred compressive stress from the refractory metal nitride film may be in the range from about 5 GPa to about 20 GPa, which exceeds the stress levels of known stress generating films employed in a stress memorization technique. The stress is memorized during an anneal and remains in the semiconductor devices after the stress generating films are removed.

According to an aspect of the present invention, a semiconductor structure is provided that comprises:
 a. at least one p-type field effect transistor (PFET) located on a semiconductor substrate and having a PFET channel under a uniaxial compressive stress in the direction of the PFET channel, wherein the uniaxial compressive stress has a magnitude in the range from about 300 MPa to about 3 GPa; and
 b. at least one n-type field effect transistor (NFET) located on the semiconductor substrate and having an NFET channel under a uniaxial tensile stress in the direction of the NFET channel.

The uniaxial tensile stress may have a magnitude in the range from about 300 MPa to about 3 GPa. The semiconductor structure may further comprise a dielectric layer abutting gate electrodes of the at least one PFET and the at least one NFET and source and drain regions of the at least one PFET and the at least one NFET. The dielectric layer may have an intrinsic stress having a magnitude less than 300 MPa, and preferably less than 30 MPa. The dielectric layer may comprise a silicon nitride.

According to another aspect of the present invention, a semiconductor structure is provided that comprises:
 a. at least one p-type field effect transistor (PFET) and at least one n-type field effect transistor (NFET) located on a semiconductor substrate;
 b. a stress-transmitting dielectric layer abutting the at least one PFET and the at least one NFET;
 c. a tensile stress generating film abutting the stress-transmitting dielectric layer and overlying an area of the at least one NFET;
 d. a compressive stress generating film abutting the stress-transmitting dielectric layer and overlying an area of the at least one PFET; and
 e. an encapsulating dielectric film abutting the compressive stress generating film and the tensile stress generating film.

The compressive stress generating film may comprise a refractory metal nitride such as TaN, TiN, WN, MoN, NbN, ReN, and a combination thereof. The compressive stress generating film may apply a compressive stress ranging from about 7 GPa to about 20 GPa in magnitude to at least one channel of the at least one PFET.

According to yet another aspect of the present invention, a method of fabricating a semiconductor structure is provided that comprises:

a. providing a semiconductor substrate;
 b. forming at least one p-type field effect transistor (PFET) and at least one n-type field effect transistor (NFET) on the semiconductor substrate;
 c. forming a stress-transmitting dielectric layer directly on the at least one PFET and the at least one NFET; and
 d. forming a compressive stress generating film directly on the stress-transmitting dielectric layer in an area overlying the at least one PFET.

The method may further comprise forming an encapsulating dielectric film directly on the compressive stress generating film and the tensile stress generating film.

The method may further comprise forming a tensile stress generating film directly on the stress-transmitting dielectric layer in an area overlying the at least one NFET. The method may further comprising transferring a uniaxial compressive stress from the compressive stress generating film to at least one channel of the at least one PFET and a uniaxial tensile stress from the tensile stress generating film to at least another channel of the at least one NFET in an anneal. The transferred compressive stress in the at least one PFET may be from about 300 MPa to about 3 GPa in magnitude. The compressive stress generating film may apply a compressive stress from about 300 MGPa to about 20 GPa to the at least one channel of the at least one PFET prior to the anneal.

The tensile stress generating film may be patterned to expose the stress-transmitting dielectric layer over the at least one PFET. The compressive stress generating film may be formed directly on the exposed stress-transmitting dielectric layer over the at least one PFET.

The method may further comprise:
 a. removing the encapsulating dielectric film, the compressive stress generating film, the tensile stress generating film, and the stress-transmitting dielectric layer; and
 b. exposing source and drain regions of the at least one PFET and the at least one NFET.

The anneal may be performed at a temperature ranging from about 950° C. to about 1,200° C. Preferably, the compressive stress generating film is a refractory metal nitride.

DETAILED DESCRIPTION

Figure 1:
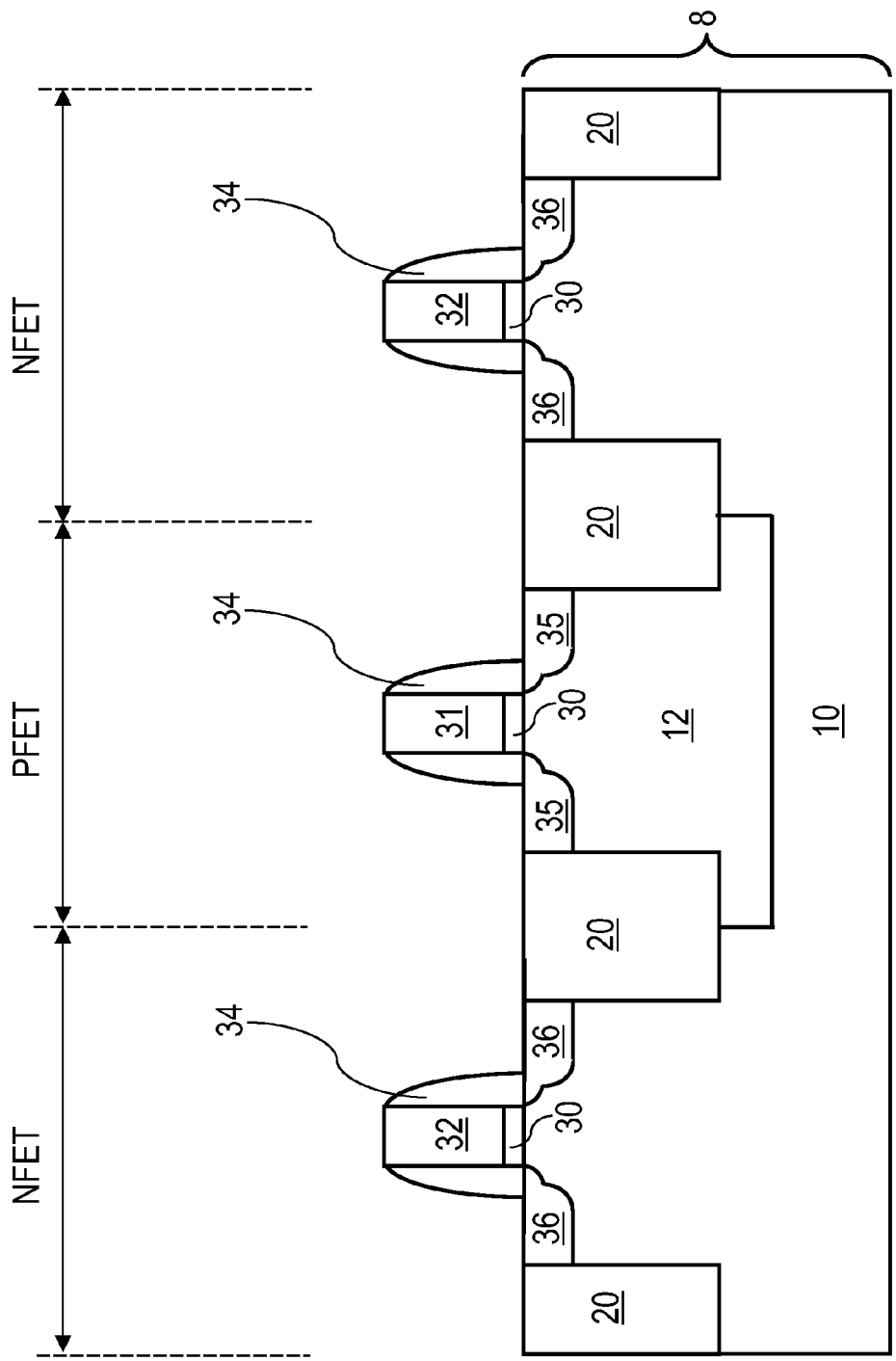
FIG. 1 is a vertical cross-sectional view of an exemplary semiconductor structure having a PFET and two NFETs after formation of gate electrodes and source and drain regions.

As stated above, the present invention relates to a semiconductor structure comprising both semiconductor devices with compressive stress memorization and semiconductor devices with tensile stress memorization on the same substrate and methods of manufacturing the same, which are now described in detail with accompanying figures. It is noted that like and corresponding elements are referred to by like reference numerals.

Referring to FIG. 1, an exemplary semiconductor structure according to the present invention comprises a semiconductor substrate 8 having a substrate layer 10, shallow trench isolation 20, and an n-well 12. One p-type field effect transistor (PFET) and two n-type field effect transistors (NFETs) are formed on the semiconductor substrate 8 employing methods well known in the art. For example, dielectric pad layers (not shown) are deposited on a semiconductor substrate 8 having a p-doping and lithographically patterned. The pattern in the dielectric pad layers is transferred into the semiconductor substrate 8 to from shallow trenches, which are then filled by a dielectric material to form the shallow trench isolation 20. Wells, such as the n-well 12 in the PFET area, are formed by patterned ion implantation. The portion of the semiconductor substrate that is not occupied by the shallow trench isolation 20 or implanted with additional dopants becomes the substrate layer 10. In the exemplary structure, the substrate layer 10 is doped with p-type dopants with a dopant concentration ranging from $1.0\times10^{15}/cm^3$ to about $1.0\times10^{19}/cm^3$.

The substrate layer 10 may comprise any semiconductor material including, but not limited to: Si, SiC, SiGe, SiGeC, Ge alloys, GaAs, InAs, InP, other III-V or II-VI compound semiconductors. In a preferred embodiment, the semiconductor substrate 10 comprises a silicon containing semiconductor material, i.e., a semiconductor material that includes silicon. The semiconductor substrate 8 may be a bulk substrate, a semiconductor-on-insulator (SOI) substrate, or a hybrid substrate having a bulk portion and a semiconductor-on-insulator portion. The semiconductor substrate 8 may be unstrained, or may have a multiple semiconductor layers having different composition, and thus having a built-in strain. Alternatively, the semiconductor substrate 8 may be substantially free from external stress prior to processing. Since the inventive stress memorization technique applies a local stress, the global stress on the substrate layer 10 may be substantially zero. The crystallographic orientation of the substrate layer 10 may be selected to maximize carrier mobility enhancement through the stress memorization technique described herein.

A gate dielectric 30 is formed on a top surface of the semiconductor layer 10 employing methods well known in the art. The gate dielectric 30 may be a thermally grown dielectric layer such as a thermal oxide, a thermal nitride, a thermal oxynitride, or a combination of a thermally grown dielectric layer and a deposited dielectric layer. Alternatively, the gate dielectric 30 may comprise a high-K dielectric material having a dielectric constant greater than 3.9. Different dielectric material may be employed between the area for the PFET and the area for the NFETs. A PFET gate electrode 31 and NFET gate electrodes 32 are formed on the gate dielectric 30, for example, by chemical vapor deposition (CVD) of a gate conductor material. The material for the PFET gate electrode 31 and the material for the NFET gate electrodes 32 may be the same or different. For example, the PFET gate electrode 31 may comprise a heavily p-doped polysilicon and the NFET gate electrodes 32 may comprise a heavily doped n-doped polysilicon. After suitable extension and halo implantations, spacers 34 are formed around the PFET gate electrode 31 and the NFET gate electrodes 32. The spacers comprise a dielectric material such as silicon oxide, silicon nitride, or a combination thereof. PFET source and drain regions 35 are formed in the PFET area by a patterned heavy ion implantation of p-type dopants and NFET source and drain regions 36 are formed in the NFET area by a patterned heavy ion implantation of n-type dopants. The source and drain regions (35, 36) have a dopant concentration in the range from about $3.0\times10^{19}/cm^3$ to about $5.0\times10^{21}/cm^3$, and preferably in the range from about $1.0\times10^{21}/cm^3$ to about $5.0\times10^{20}/cm^3$.

Figure 2:
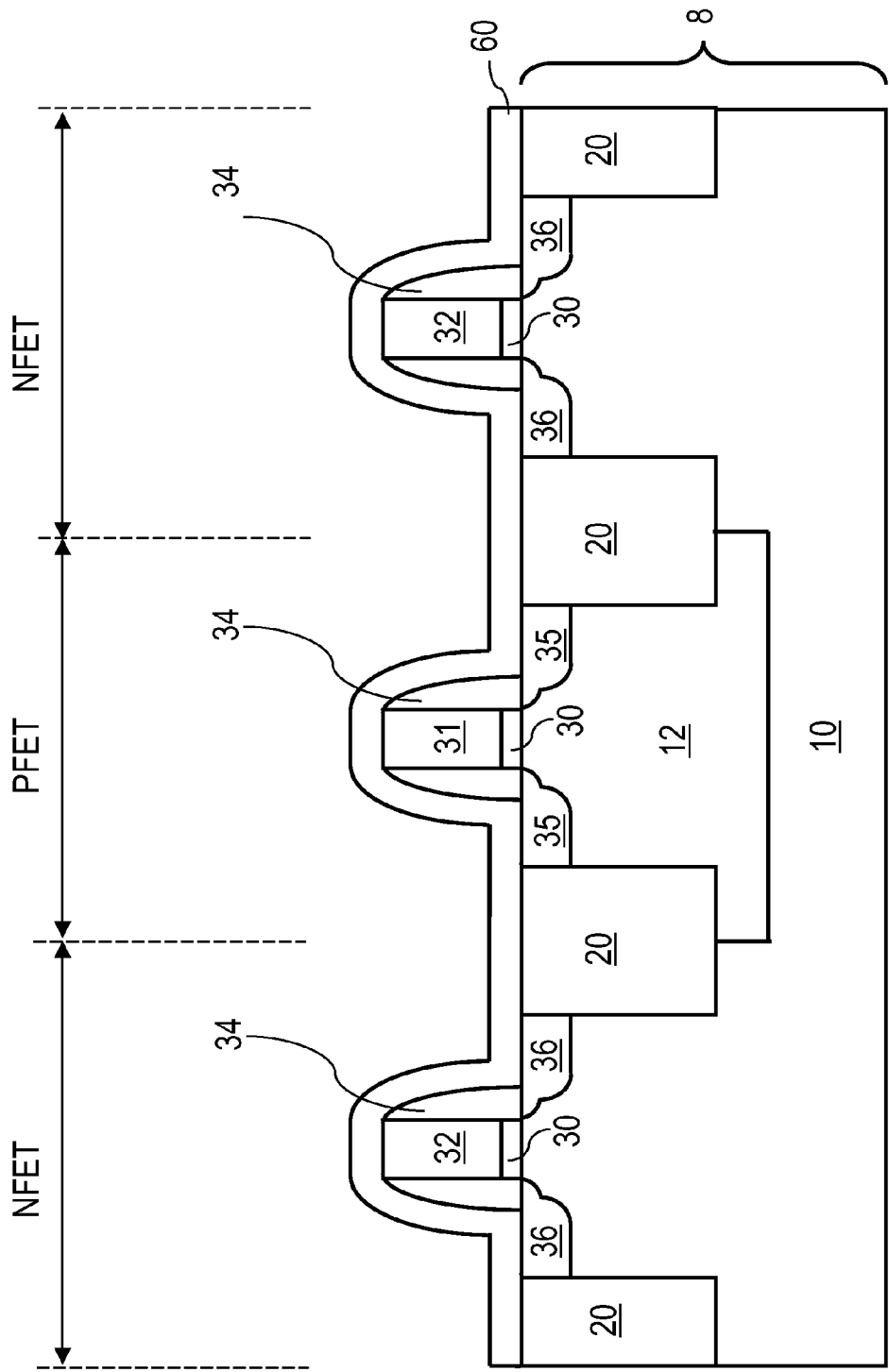
FIG. 2 is a vertical cross-sectional view of the exemplary semiconductor structure after formation of a stress-transmitting dielectric layer over the PFET and NFETs.

Referring to FIG. 2, a stress-transmitting dielectric layer 60 is formed over the PFET gate electrode 31, the NFET gate electrodes 32, the spacers 34, the PFET source and drain regions 35, the NFET source and drain regions 36, and top surfaces of the shallow trench isolation 20. The stress-transmitting dielectric layer 60 does not have an intrinsic stress of substantial magnitude. For example, the stress-transmitting dielectric layer 60 has an intrinsic stress not exceeding 100 MPa, and preferably not exceeding 10 MPa. However, external stress may be transmitted through the stress-transmitting dielectric layer 60. To enable efficient transmission of external stress through the stress-transmitting dielectric layer 60, a high value of Young's modulus is preferred. Preferably, Young's modulus of the stress-transmitting dielectric layer 60 exceeds 10 GPa. More preferably, Young's modulus of the stress-transmitting dielectric layer 60 exceeds 40 GPa. Preferably, the stress-transmitting dielectric layer 60 is conformal, i.e., has substantially the same thickness on sidewalls of a structure as on a top surface of the structure. The thickness of the stress-transmitting dielectric layer 60 may be in the range from about 5 nm to about 50 nm.

For example, the stress-transmitting dielectric layer 60 may be a silicon oxide such as borophosphosilicate glass (BPSG), borosilicate glass (BSG), phosphosilicate glass (PSG), fluorosilicate glass (FSG), and undoped silicate glass (USG). The various silicate glasses have values of Young's modulus in the range from about 40 GPa to about 100 GPa. The stress-transmitting dielectric layer 60 may be a low temperature oxide (LTO) that is formed by plasma enhanced chemical vapor deposition (PECVD) at a temperature ranging from about 400° C. to about 600° C. Alternatively, other dielectric materials such as silicon nitride or high-K dielectric materials having Young's modulus greater than 10 GPa may be employed.

Figure 3:
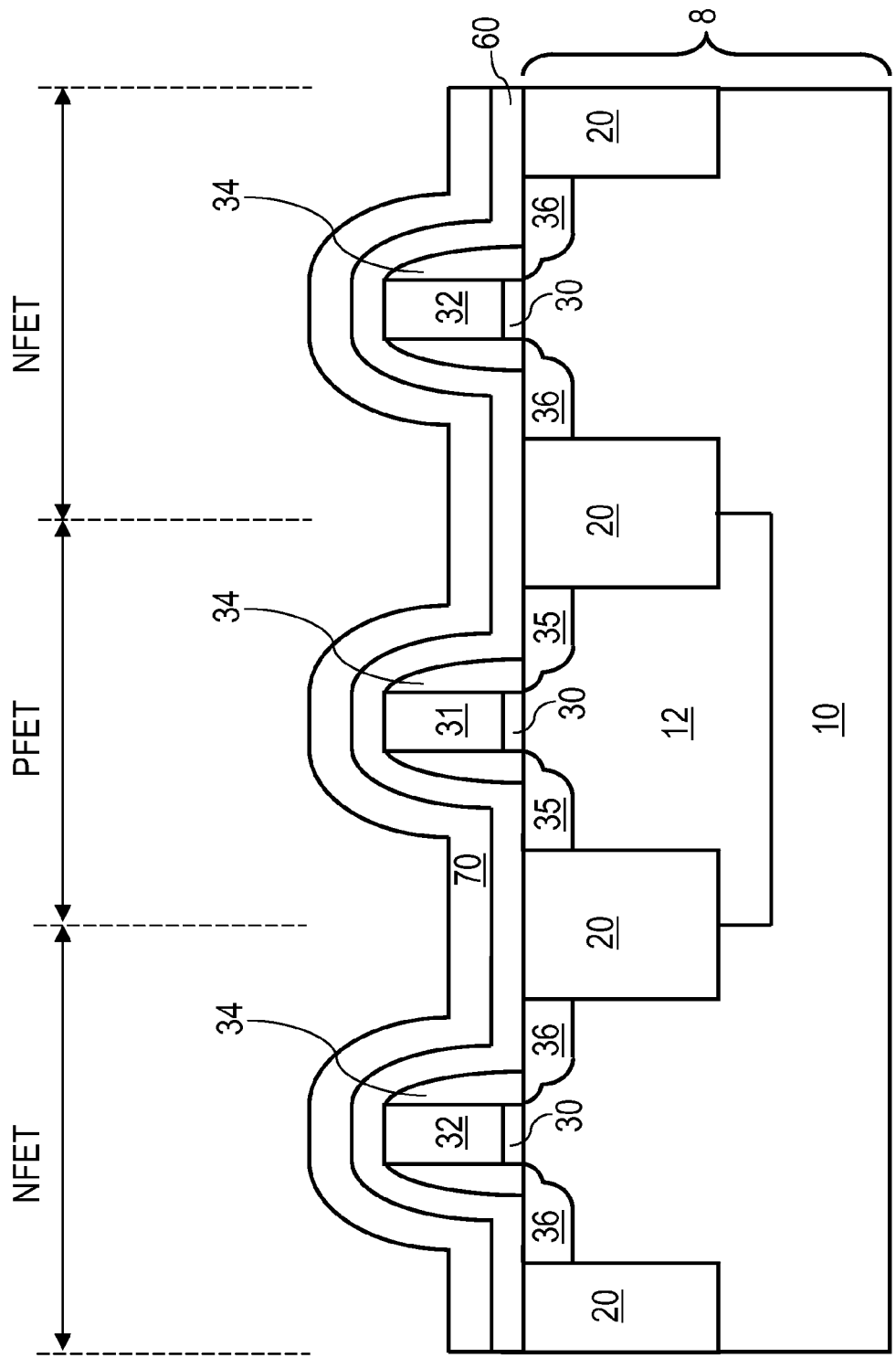
FIG. 3 is a vertical cross-sectional view of the exemplary semiconductor structure after formation of a tensile stress generating film over the stress-transmitting dielectric layer.

Referring to FIG. 3, a tensile stress generating film 70 is formed over the stress-transmitting dielectric layer 60, for example, by a blanket chemical vapor deposition (CVD). The tensile stress generating film 70 applies a tensile stress on the underlying structures, i.e., on the channel of the PFET and on the channel of the NFETs. The tensile stress is transmitted through the stress-transmitting dielectric layer 60 to the channels of the PFET and the NFETs. The tensile stress applied to the channels of the PFET and the NFETs is a uniaxial tensile stress along the direction of the channels and has a magnitude ranging from about 300 MPa to about 3 GPa, and typically ranging from about 500 MPa to about 2 GPa. Preferably, the tensile stress generating film 70 is conformal, i.e., has substantially the same thickness on sidewalls of a structure as on a top surface of the structure. The thickness of the tensile stress generating film 70 may be in the range from about 30 nm to about 120 nm, and typically in the range from about 50 nm to about 100 mm.

The tensile stress generating film 70 is typically a dielectric film. For example, the tensile stress generating film 70 may be a tensile silicon nitride film. The tensile stress generating film 70 may be formed by plasma enhanced chemical vapor deposition (PECVD) or high density plasma chemical vapor deposition (HDPCVD) at a temperature ranging from about 400° C. to about 600° C. Alternatively, other dielectric materials capable of generating a tensile stress on underlying structures may be employed.

Figure 4:
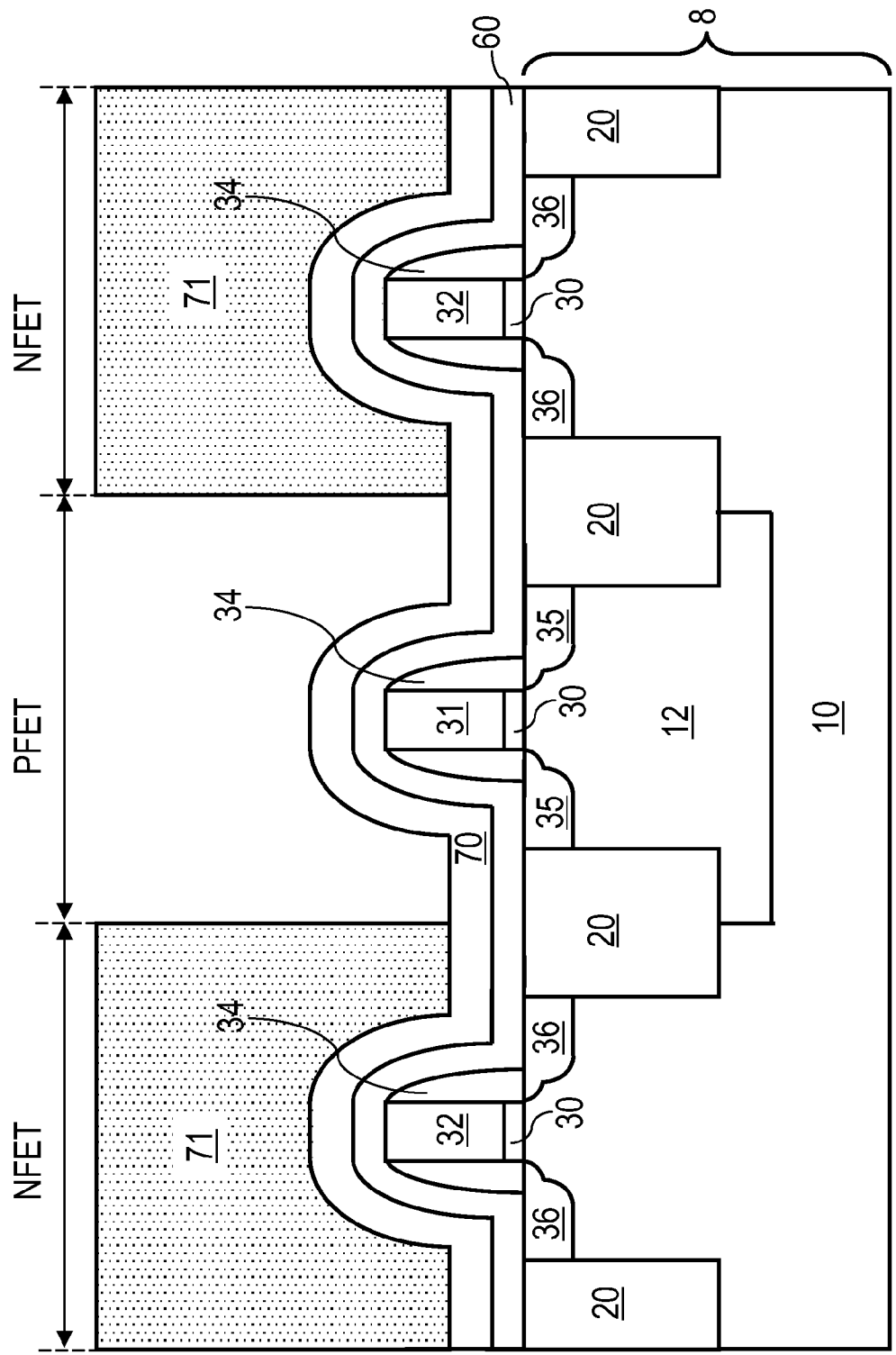
FIG. 4 is a vertical cross-sectional view of the exemplary semiconductor structure after application and patterning of a first photoresist.

Referring to FIG. 4, a first photoresist 71 is applied over the tensile stress generating film 70 and lithographically patterned with a block mask so that the portion of the first photoresist 71 in the area of the semiconductor substrate 8 in which a tensile stress is not desired is removed. The area from which the first photoresist 71 is removed includes the PFET area containing the PFET. The block mask may be a mid-ultraviolet (MUV) mask or a deep ultraviolet (DUV) mask.

The patterned first photoresist covers at least the two NFETs. In general, the first photoresist 71 covers structures, including NFETs, to which transfer of the tensile stress is desired. The first photoresist 71 is removed from above structures, including PFETs, to which transfer of the tensile stress is not desired.

Figure 5:
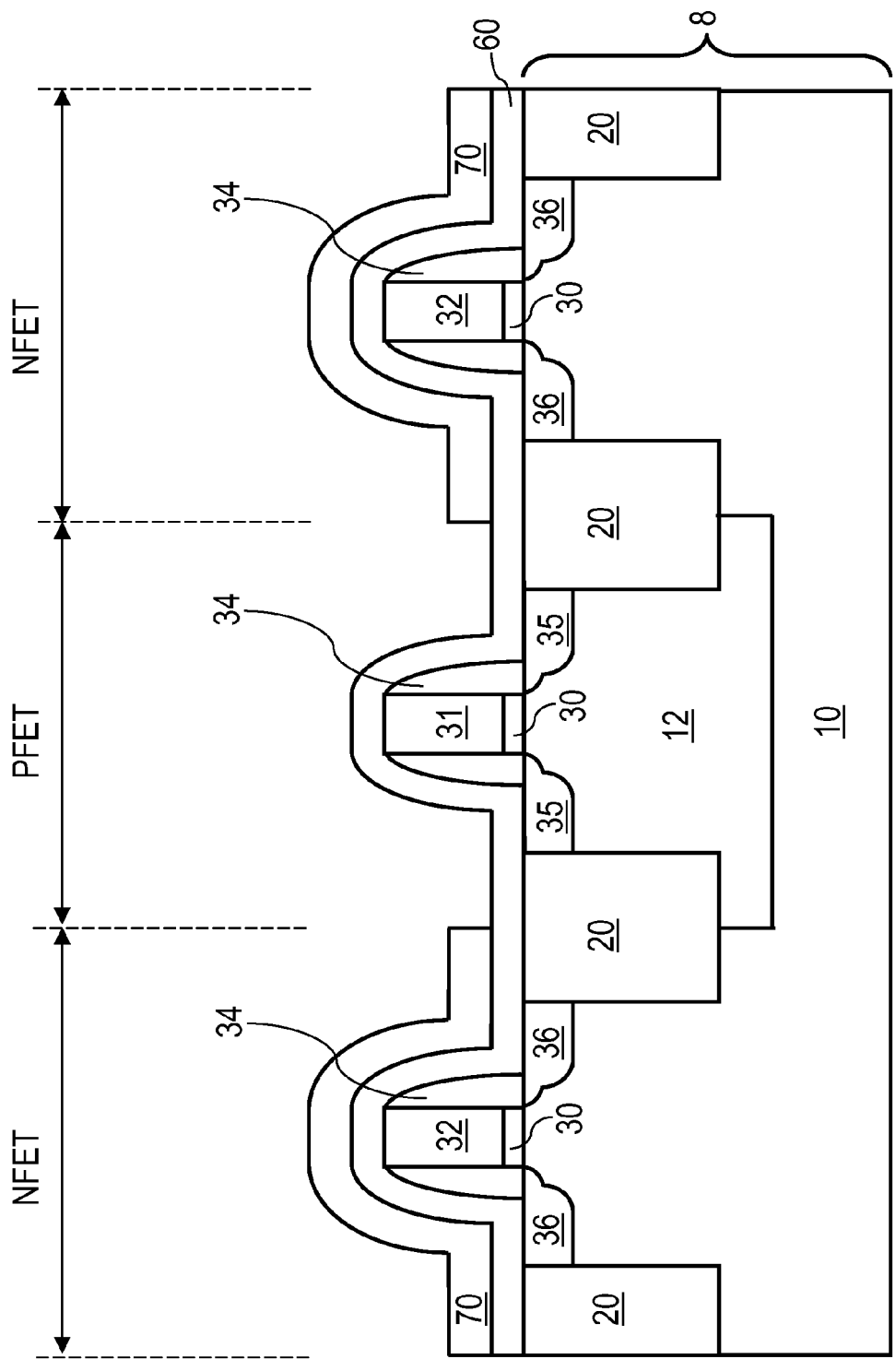
FIG. 5 is a vertical cross-sectional view of the exemplary semiconductor structure after removal of a portion of the tensile stress generating film from over the PFET area.

Referring to FIG. 5, the exposed portions of the tensile stress generating film 70 is etched by a first reactive ion etch employing the patterned first photoresist 71 as an etch mask. Preferably, the first reactive ion etch is an anisotropic etch that is selective to the underlying stress-transmitting dielectric layer 60. The remaining first photoresist 71 is thereafter removed, for example, by ashing. The exposed surfaces of the semiconductor structure may be cleaned by a wet clean as needed.

Figure 6:
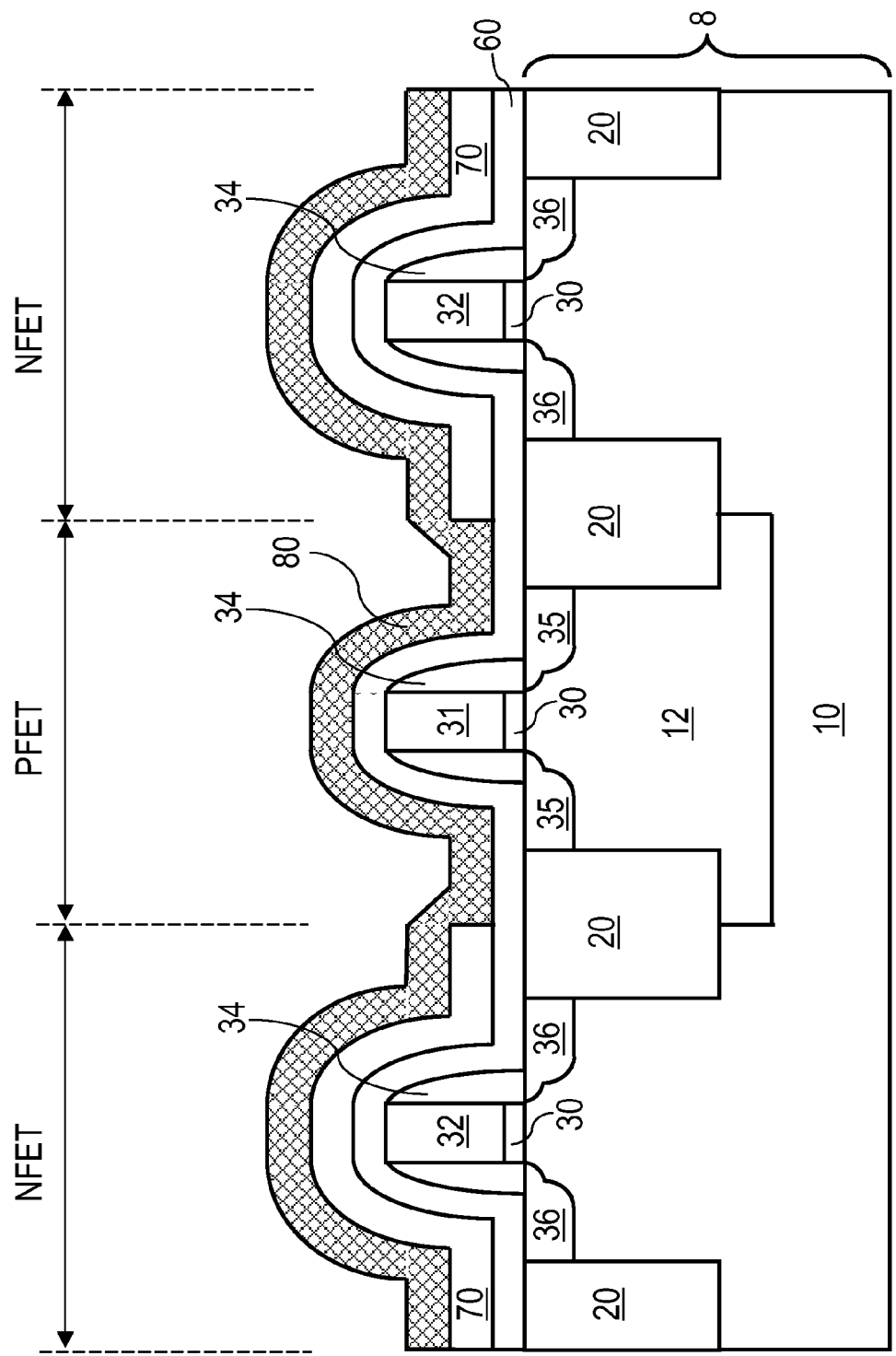
FIG. 6 is a vertical cross-sectional view of the exemplary semiconductor structure after formation of a compressive stress generating film.

Referring to FIG. 6, a compressive stress generating film 80 is formed over the patterned tensile stress generating film 70 and the stress-transmitting dielectric layer 60, for example, by a blanket chemical vapor deposition (CVD) or by a physical vapor deposition (PVD), i.e., sputtering. The compressive stress generating film 80 applies a compressive stress on the channel of the PFET through the stress-transmitting dielectric layer 60. As deposited, the compressive stress generating film 80 also applies a compress stress on the channel of the NFET through the patterned tensile stress generating film 70 and the stress-transmitting dielectric layer 60. The compressive stress applied to the channel of the PFET is a uniaxial compressive stress along the direction of the channel and has a magnitude ranging from about 5 GPa to about 20 GPa, and typically ranging from about 10 GPa to about 15 GPa. Preferably, the compressive stress generating film 80 is conformal, i.e., has substantially the same thickness on sidewalls of a structure as on a top surface of the structure. The thickness of the compressive stress generating film 80 may be in the range from about 30 nm to about 120 nm, and typically in the range from about 50 nm to about 100 nm.

Preferably, the compressive stress generating film 80 comprises a refractory metal nitride. For example, the compressive stress generating film 80 may comprise TaN, TiN, WN, MoN, NbN, ReN, or a combination thereof. In a preferred embodiment, the compressive stress generating film 80 is TiN.

During research leading to the present invention, it has been observed that a TiN film having a thickness in the range from about 50 nm to about 100 nm transfers a uniaxial compressive stress to underlying semiconductor structures, and specifically to the channel of a field effect transistor in the direction of the channel, i.e., in the direction along the source and the drain of the transistor. The uniaxial compressive stress has a magnitude from about 10 GPa to about 15 GPa prior to a thermal treatment, and is reduced to a range from about 300 MPa to about 3 GPa after a high temperature anneal at a temperature in the range from about 1,000° C. to about 1,100° C. It is expected that other refractory metal nitride films are also capable of transferring a similar level of stress to underlying semiconductor structures.

Figure 7:
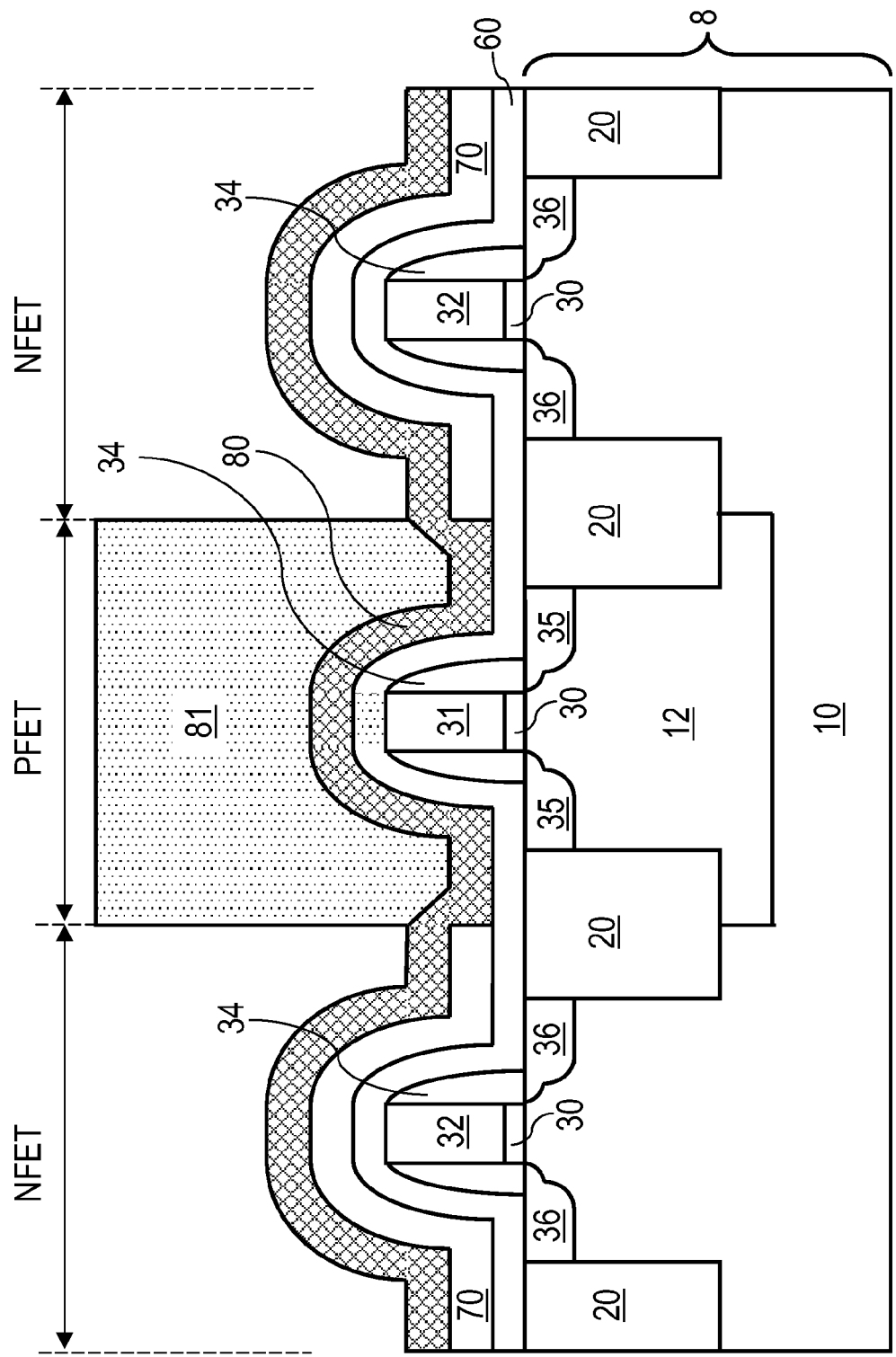
FIG. 7 is a vertical cross-sectional view of the exemplary semiconductor structure after application and patterning of a second photoresist.

Referring to FIG. 7, a second photoresist 81 is applied over the compressive stress generating film 80 and lithographically patterned with a block mask so that the portion of the second photoresist 81 in an area of the semiconductor substrate 8 in which a compressive stress is not desired is removed. The area from which the second photoresist 81 is removed includes the NFET area containing the NFETs. The block mask may be a mid-ultraviolet (MUV) mask or a deep ultraviolet (DUV) mask.

The patterned second photoresist covers at least the PFET. In general, the second photoresist 81 covers structures, including PFETs, to which transfer of the compressive stress is desired. The second photoresist 81 is removed from above structures, including NFETs, to which transfer of the compressive stress is not desired.

Figure 8:
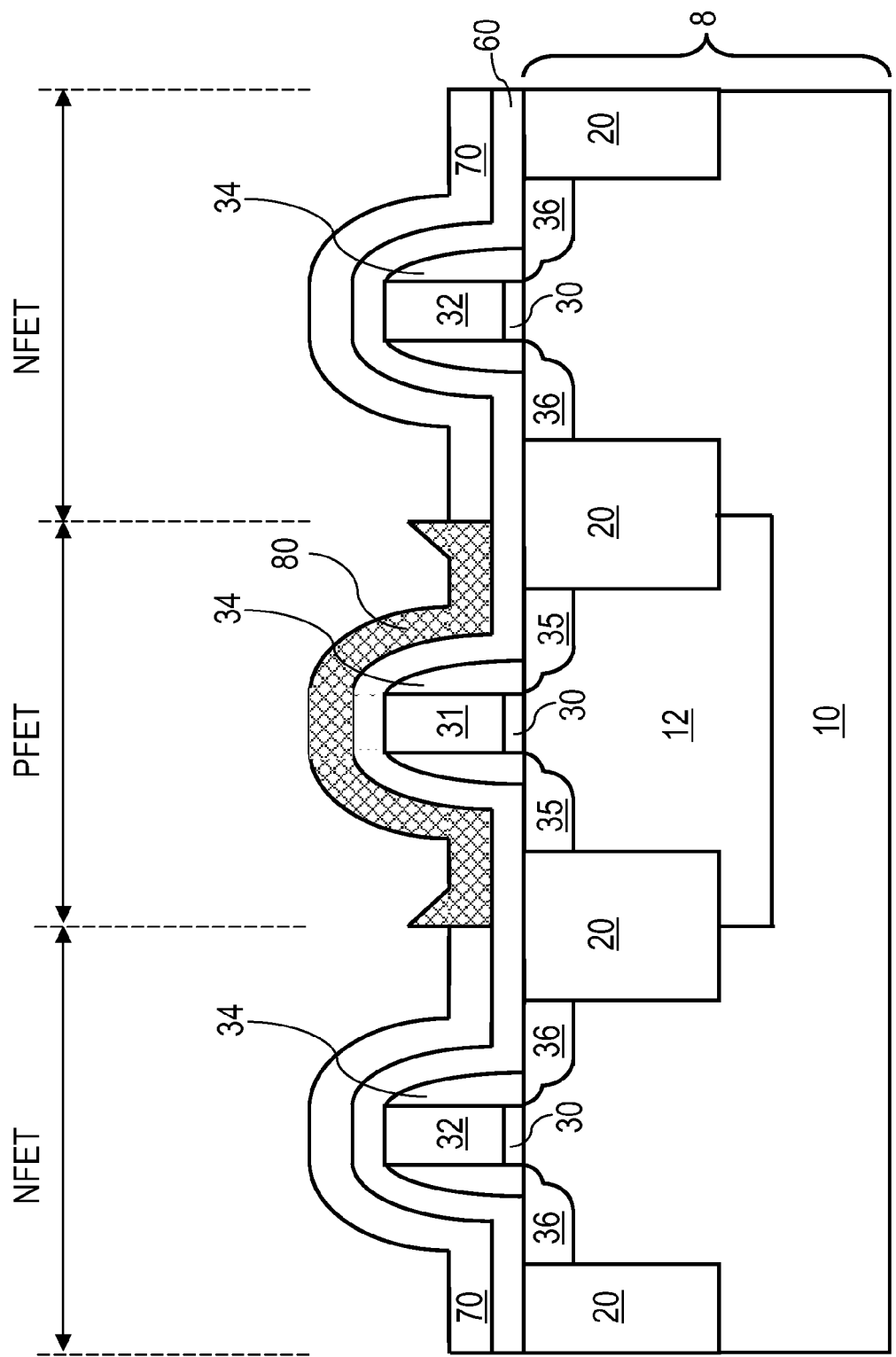
FIG. 8 is a vertical cross-sectional view of the exemplary semiconductor structure after removal of the compressive stress generating film from over the NFET areas.

Referring to FIG. 8, the exposed portions of the compressive stress generating film 80 is etched by a second reactive ion etch employing the patterned second photoresist 81 as an etch mask. Preferably, the second reactive ion etch is an anisotropic etch that is selective to the underlying tensile stress generating film 70. The remaining second photoresist 81 is thereafter removed, for example, by ashing. The exposed surfaces of the semiconductor structure may be cleaned by a wet clean as needed.

The edges of the patterned tensile stress generating film 70 and the patterned compressive stress generating film 80 may overlap, underlap, or be perfectly aligned. While overlapping or perfectly aligned edges of the patterned tensile stress generating film 70 and the patterned compressive stress generating film 80 are preferred, the present invention may be practiced with an underlap between the edges of the patterned tensile stress generating film 70 and the patterned compressive stress generating film 80 as well.

By the removal of the compressive stress generating film 80 from above the NFETs, a compressive stress is no longer applied to the channels of the NFETs. Therefore, the compressive stress generated by the compressive stress generating film 80 is not transmitted to the NFETs. The NFETs are subjected only to the tensile stress generated by the tensile stress generating film 70.

Figure 9:
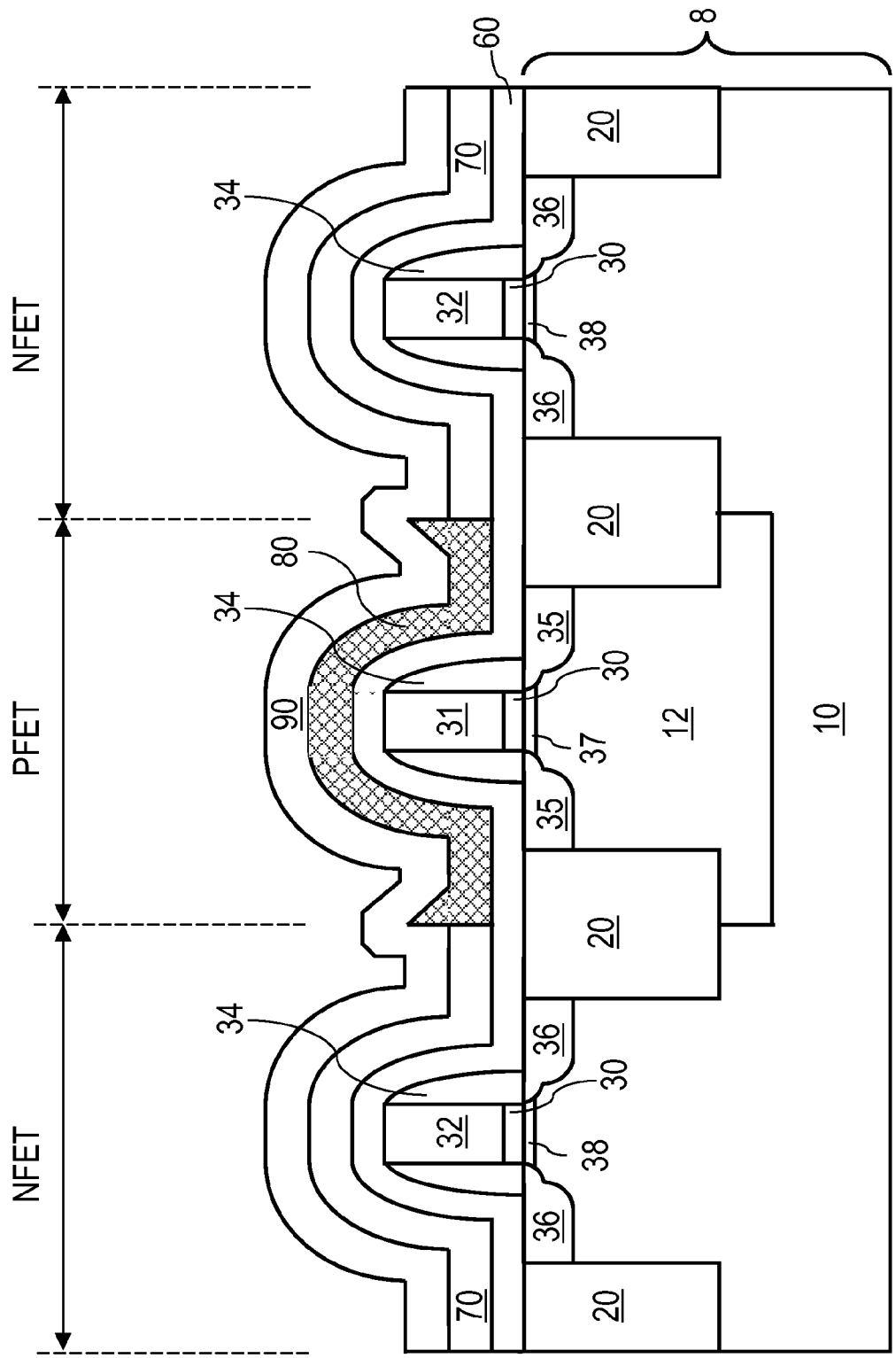
FIG. 9 is a vertical cross-sectional view of the exemplary semiconductor structure after formation of an encapsulating dielectric film.

Referring to FIG. 9, an encapsulating dielectric film 90 is deposited over the patterned tensile stress generating film 70 and the patterned compressive stress generating film 80. The encapsulating dielectric film 90 is a dielectric film, and may be a silicon nitride film or a silicon oxide film. The thickness of the encapsulating dielectric film 90 may be from about 20 nm to about 200 nm, and typically from about 50 nm to about 100 nm. In the case a refractory metal nitride is employed as the compressive stress generating film 80, presence of the encapsulating dielectric film 90 is preferred to seal the patterned compressive stress generating film 80 to prevent metallic contamination of process chambers employed in an anneal step to be subsequently performed. In the case a non-metallic compressive stress generating film 80 is employed, the encapsulating dielectric film 90 is optional.

The exemplary semiconductor structure is annealed at a high temperature to induce "memorization" of stress by the semiconductor structures underneath the stress-transmitting layer 60, which includes the compressive stress applied to the PFET channel 37 of the PFET and the tensile stress applied to the NFET channels 38 of the NFETs. The anneal may be performed at a temperature ranging from about 950° C. to about 1,200° C. The duration of the anneal at the anneal temperature may be from about 0.1 second to about 10 minutes, and typically from about 1 second to about 30 seconds.

During the anneal, the structures of the PFET and the NFETs, which are under stress, are stabilized and the built-in stress is permanently transferred into the underlying PFET and the NFETs, including the PFET channel 37 and the NFET channel 38. The magnitude of the uniaxial compressive stress applied by the patterned compressive stress generating film 80 to the PFET channel 37 of the PFET during the anneal is not clear since measurement of stress at a high temperature is difficult. It is speculated that the magnitude of the compressive stress applied by the patterned compressive stress generating film 80 to the PFET channel 37 of the PFET during the anneal is less than the magnitude of the compressive stress applied to the same structure prior to the anneal. Empirically, the compressive stress applied by the patterned compressive stress generating film 80 to the PFET channel 37 of the PFET decreases to a range from about 300 MPa to about 3 GPa after the anneal. As noted before, a memorized compressive stress in this range has been previously unknown in the art. During the transfer and memorization of the compressive stress, the magnitude of the uniaxial stress on the PFET channel 37 decreases from a range from about 5 GPa to about 20 GPa prior to the anneal to a range from about 300 MPa to about 3 GPa after the anneal.

In contrast to the substantial reduction of the compressive stress, the tensile stress applied by the patterned tensile stress generating film 70 to the NFET channels 38 of the NFETs does not necessarily decrease substantially, Some materials that provide substantially the same tensile stress from about 300 MPa to about 3 GPa to the PFET channels 38 of the PFETs prior to and after the anneal are known in the art. Thus, a substantial portion of the tensile stress on the PFET channels 38 is memorized in the semiconductor structure during the anneal.

Figure 10:
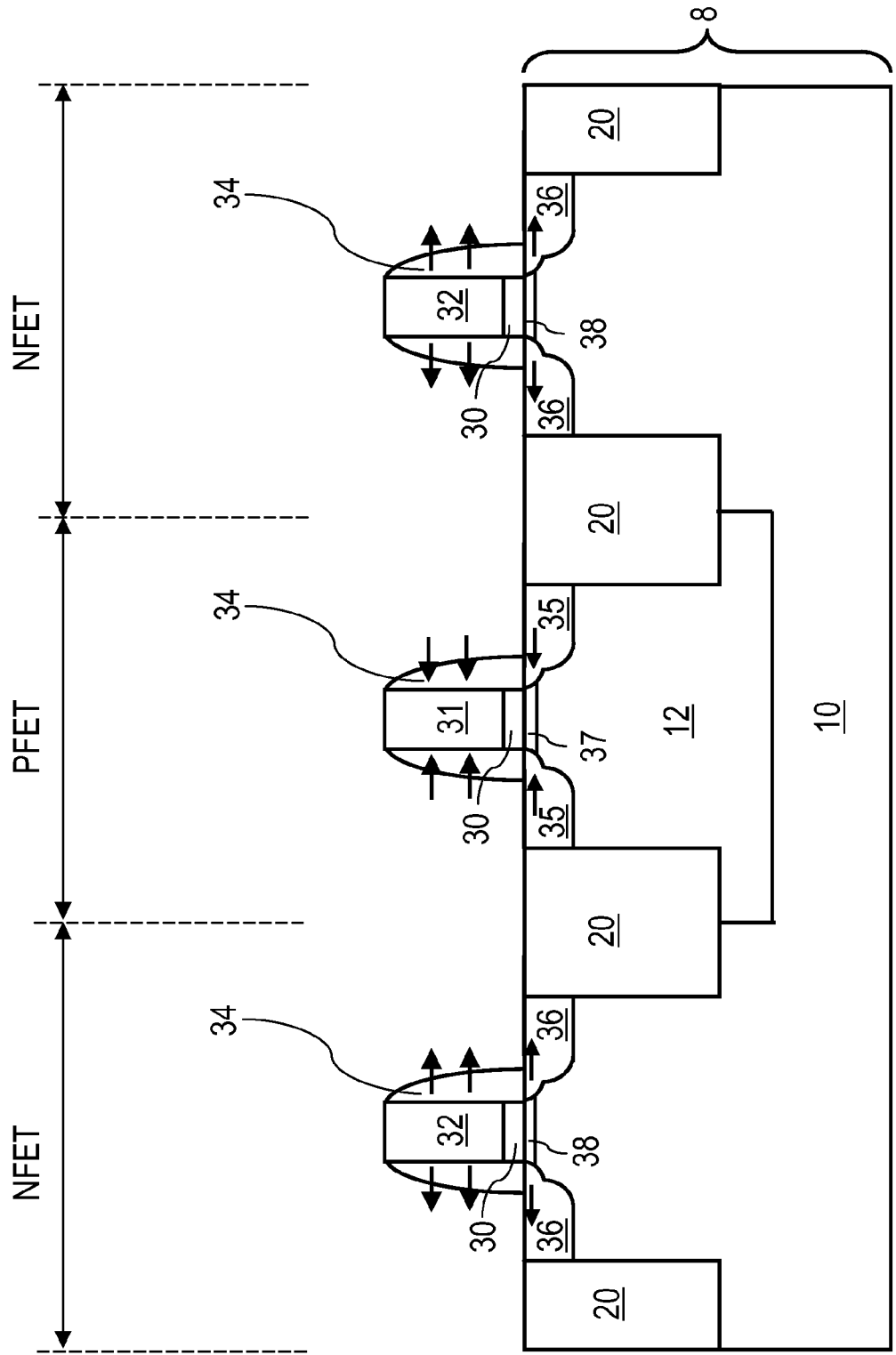
FIG. 10 is a vertical cross-sectional view of the exemplary semiconductor structure after removal of the encapsulating dielectric film, the compressive stress generating film, the tensile stress generating film, and the stress-transmitting dielectric layer.

Referring to FIG. 10, the encapsulating dielectric film 90, the patterned compressive stress generating film 80, the patterned tensile stress generating film 70, and the stress-transmitting layer 60 are removed by wet etches, dry etches, or a combination of both. Since the transferred stress is now permanently built into the PFET and the NFETs, the PFET channel 37 and the NFET channels 38 are under substantially the same stress as before the removal of the stress generating films (70, 80). Specifically, the PFET has a PFET channel 35 under a uniaxial compressive stress having a magnitude in the range from about 300 MPa to about 3 GPa in the direction of the channel. The NFETs have NFET channels 36 under a uniaxial tensile stress having a magnitude in the range from about 300 MPa to about 3 GPa. The minority carrier mobility is correspondingly enhanced, and as a consequence, the on-current of the PFET and the NFETs also increase.

Figure 11:
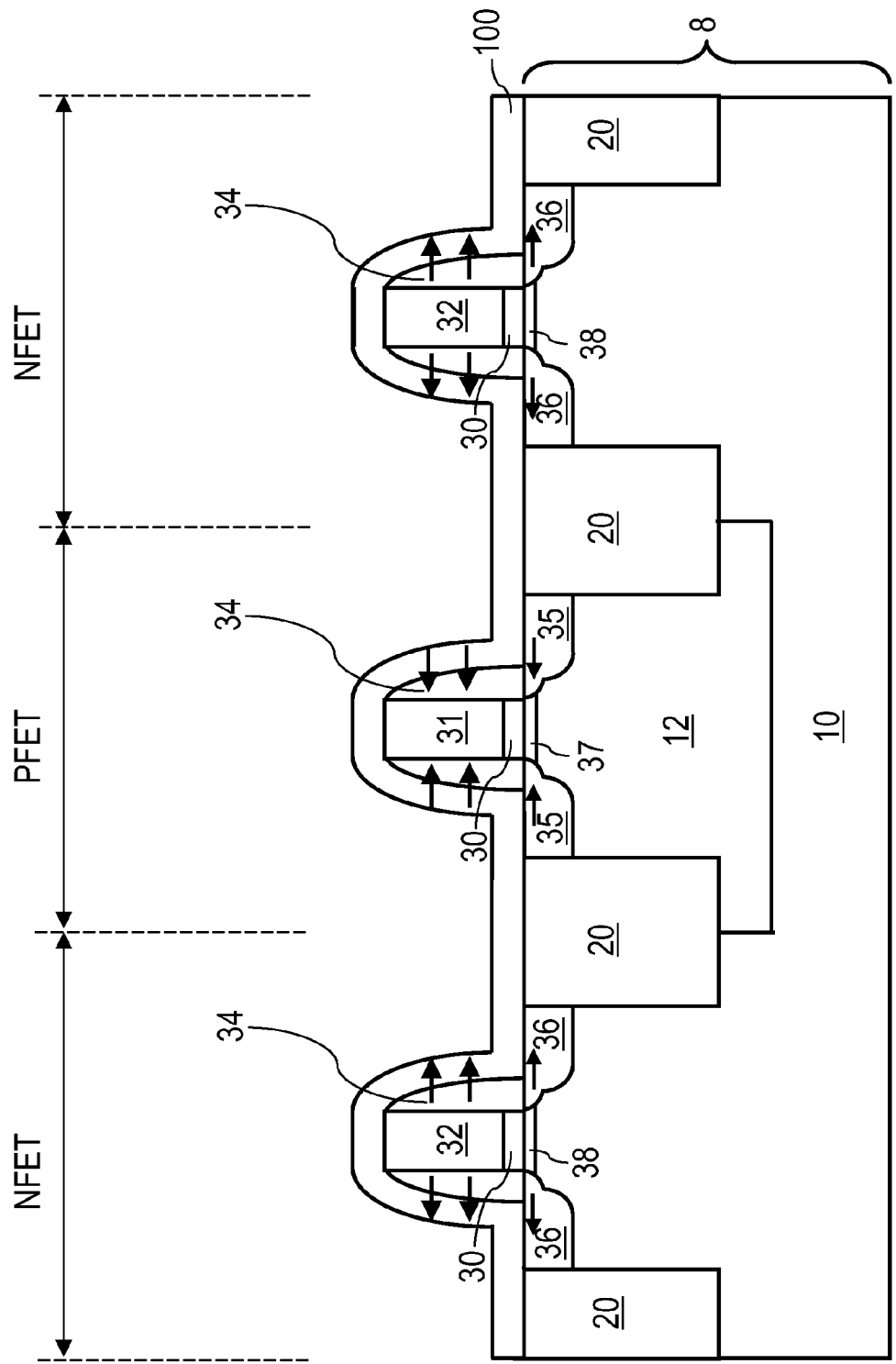
FIG. 11 is a vertical cross-sectional view of the exemplary semiconductor structure after formation of a dielectric layer.

Referring to FIG. 11, a dielectric layer 100 may be formed on the PFET and the NFETs. Specifically, the dielectric layer 100 abuts gate electrodes of the PFET and the NFETs and the source and drain regions (35, 36) of the PFET and the NFETs. Preferably, the dielectric layer 100 serves as a mobile ion diffusion blocking layer that prevents mobile ions such as Na+ and K+ from diffusing from back-end-of-line (BEOL) dielectric layer stack into the semiconductor substrate 8. Preferably, the dielectric layer 100 has an insignificant level of intrinsic stress, e.g., an intrinsic stress having a magnitude less than 300 MPa, and preferably less than 30 MPa. The dielectric layer 100 may comprise a silicon nitride.

Middle-of-line dielectric layer (not shown) is typically deposited over the exemplary semiconductor structure followed by formation of contact vias. Back-end-of-line (BEOL) dielectric layers and metal wiring are formed as is well known in the art.

The order of formation of the tensile stress generating film 70 and the compressive stress generating film 80 may be reversed with corresponding changes in the patterns of the photoresists during the patterning of the tensile stress generating film 70 and the compressive stress generating film 80 such that the same structure as the exemplary semiconductor structure is obtained. Such reversal in the order of processing and adjustments in the patterns in the photoresist are explicitly contemplated herein.

One skilled in the art would recognize that the stress memorization technique employing the compressive stress generating film 80 may be employed on any semiconductor device other than a field effect transistor. Further, the compressive stress generating film 80 may be employed without utilizing the tensile stress generating film 70. Also, the formation of the encapsulating dielectric film may be omitted if metal contamination is not a concern. Such applications are herein explicitly contemplated.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure, comprising:
    providing a semiconductor substrate;
    forming at least one p-type field effect transistor (PFET) and at least one n-type field effect transistor (NFET) on said semiconductor substrate;
    forming a stress-transmitting dielectric layer directly on said at least one PFET and said at least one NFET;
    forming a tensile stress generating film directly on said stress-transmitting dielectric layer in an area overlying said at least one NFET;
    forming a compressive stress generating film directly on said stress-transmitting dielectric layer and only overlying said at least one PFET, wherein said compressive stress generating film applies a compressive stress having magnitude from about 5 GPa to about 20 GPa to a structure underneath; and
    forming an encapsulating dielectric film directly on said compressive stress generating film and said tensile stress generating film.

2. The method of claim 1, further comprising transferring a uniaxial compressive stress from said compressive stress generating film to at least one channel of said at least one PFET and a uniaxial tensile stress from said tensile stress generating film to at least another channel of said at least one NFET in an anneal.

3. The method of claim 2, wherein said transferred compressive stress in said at least one PFET is from about 300 MPa to about 3 GPa in magnitude.

4. The method of claim 2, wherein said transferring of said uniaxial compressive stress is effected by an anneal at a temperature ranging from about 950° C. to about 1,200° C.

5. The method of claim 2, further comprising:
removing said encapsulating dielectric film, said compressive stress generating film, said tensile stress generating film, and said stress-transmitting dielectric layer; and
exposing source and drain regions of said at least one PFET and said at least one NFET.

6. The method of claim 1, wherein said compressive stress generating film is a refractory metal nitride.

* * * * *